US011202141B2

(12) United States Patent
Yang et al.

(10) Patent No.: US 11,202,141 B2
(45) Date of Patent: Dec. 14, 2021

(54) BUTTON SOUND-EMITTING APPARATUS AND ELECTRONIC DEVICE

(71) Applicant: GOERTEK INC., Shandong (CN)

(72) Inventors: Xinfeng Yang, Shandong (CN); Fenglei Zu, Shandong (CN)

(73) Assignee: Goertek, Inc., Shandong (CN)

( * ) Notice: Subject to any disclaimer, the term of this patent is extended or adjusted under 35 U.S.C. 154(b) by 0 days.

(21) Appl. No.: 17/054,591

(22) PCT Filed: Dec. 28, 2018

(86) PCT No.: PCT/CN2018/124941
§ 371 (c)(1),
(2) Date: Nov. 11, 2020

(87) PCT Pub. No.: WO2020/107620
PCT Pub. Date: Jun. 4, 2020

(65) Prior Publication Data
US 2021/0195314 A1  Jun. 24, 2021

(30) Foreign Application Priority Data

Nov. 27, 2018  (CN) .................. 201811428839.X

(51) Int. Cl.
H04R 1/22 (2006.01)
H04R 9/06 (2006.01)
H05K 5/02 (2006.01)

(52) U.S. Cl.
CPC ............... H04R 1/22 (2013.01); H04R 9/06 (2013.01); H05K 5/0217 (2013.01)

(58) Field of Classification Search
CPC . H04R 11/02; H04R 5/00; H04R 5/02; H04R 5/04; H04R 3/12; H04R 2205/022; H04R 2205/024; H04R 2420/00; H04R 2420/03
See application file for complete search history.

(56) References Cited

U.S. PATENT DOCUMENTS 6,570,994 B1 * 5/2003 Berthoud ............... H04R 9/00
340/407.1
2015/0264489 A1 * 9/2015 Kushima ............... H04R 7/045
381/338

* cited by examiner

Primary Examiner — Walter F Briney, III
(74) Attorney, Agent, or Firm — Baker Botts, LLP

(57) ABSTRACT

Disclosed are a button sound-emitting apparatus and an electronic device. The button sound-emitting apparatus comprises a cap part, a exciter, and an elastic component; said elastic component is arranged at an edge of the cap part; said exciter is provided in the middle of the cap part; the elastic component is connected to a housing of the electronic device; the exciter is suspended in the housing; the elastic component is configured for providing an elastic restoring force; the exciter is configured to be used for providing a driving force. The button sound-emitting apparatus is simple in structure and eliminates the need to arrange a front acoustic cavity and a sound outlet hole, and ensures good sound performance.

11 Claims, 2 Drawing Sheets

BUTTON SOUND-EMITTING APPARATUS AND ELECTRONIC DEVICE

CROSS-REFERENCE TO RELATED APPLICATIONS

This application is a National Stage of International Application No. PCT/CN2018/124941, filed on Dec. 28, 2018, which claims priority to Chinese Patent Application No. 201811428839.X, filed on Nov. 27, 2018, both of which are hereby incorporated by reference in their entireties.

TECHNICAL FIELD

The present invention relates to the technical field of electro-acoustic conversion, and more specifically, to a button sound-emitting apparatus and an electronic device.

BACKGROUND

With the increasing demand for the appearances of electronic products such as mobile phones and tablets, the full screen and non-porous front surface design has become a development trend.

In order to achieve a good sound-emitting effect, a side sound-emitting speaker module is typically used. The side sound-emitting speaker module usually has a front sound cavity and a sound-emitting hole. The sound cavity and the sound-emitting hole together form an acoustic resonator. In some examples, the resonance frequency of the acoustic resonator is below 10 kHz, for example, 3-4 kHz. Upon this resonance frequency, a sound pressure frequency response of the speaker module drops rapidly, resulting in an insufficient high-frequency response of the electronic product, which cannot meet consumers' demands on the high-fidelity music playback.

Therefore, it is necessary to provide a new technical solution to solve the above technical problems.

SUMMARY

An object of the present invention is to provide a new technical solution of a button sound-emitting apparatus.

According to the first aspect of the present invention, a button sound-emitting apparatus is provided. The button sound-emitting apparatus comprises a cap part, an exciter, and an elastic component, wherein the elastic component is arranged at an edge of the cap part, the exciter is arranged in a middle of the cap part, the elastic component is connected to a housing of an electronic device, the exciter is suspended in the housing, the elastic component is configured to provide an elastic restoring force, and the exciter is configured to provide a driving force.

Optionally, the cap part is of a sheet-like structure.

Optionally, the exciter comprises a piezoelectric exciter, a moving coil exciter, a moving iron exciter, a moving magnetic exciter or a magnetostrictive exciter.

Optionally, the elastic component is a double-sided tape.

According to another embodiment of the present disclosure, an electronic device is provided. The device comprises a housing and the above-mentioned button sound-emitting apparatus, wherein a mounting hole is formed on the housing, the elastic component is connected with the housing, and the exciter is suspended in the mounting hole.

Optionally, a concave annular step structure is provided on the housing where it embraces the mounting hole, and the elastic component is embedded in the annular step structure.

Optionally, the button sound-emitting apparatus is arranged on a side wall of the housing.

Optionally, a plurality of the button sound-emitting apparatuses are provided, and the plurality of the button sound-emitting apparatuses produce a stereo effect.

Optionally, the device further comprises a gravity sensor and a sound channel control module connected to the gravity sensor, wherein the gravity sensor is configured to sense azimuth information of the electronic device, and the sound channel control module is configured to obtain the azimuth information and switch channel modes of a plurality of the button sound-emitting apparatuses according to the azimuth information.

Optionally, a plurality of the button sound-emitting apparatuses comprise a first button sound-emitting apparatus and a second button sound-emitting apparatus, and wherein an operation frequency of the first button sound-emitting apparatus is above 2 KHz, and an operation frequency of the second button sound-emitting apparatus is below 1 KHz.

Optionally, a plurality of the button sound-emitting apparatuses is symmetrically arranged on the housing in pairs.

According to an embodiment of the present disclosure, the exciter vibrates and drives the cap part to vibrate, so as to directly radiate sound outwards. The sound-emitting direction is perpendicular to a main plane of the cap part, such as a front or back surface thereof. The button sound-emitting apparatus is installed on a surface of the electronic device. The button sound-emitting apparatus directly radiates sound outwards without a front acoustic cavity or a sound-emitting hole, and would not form an acoustic resonator. This ensures a good sound-emitting effect of the button sound-emitting apparatus, and especially a good high-frequency sound-emitting effect.

Other features and advantages of the invention will become clear from the following detailed description of exemplary embodiments of the invention with reference to the drawings.

BRIEF DESCRIPTION OF THE DRAWINGS

The above and/or additional aspects and advantages of the present disclosure will become apparent and readily understood from the description of the embodiments in combination with the drawings hereinafter.

The drawings incorporated in the specification and constituting a part of the specification illustrate the embodiments of the present invention, and together with the description are used to explain the principle of the present invention.

DESCRIPTION OF REFERENCE SIGNS

Figure 1:
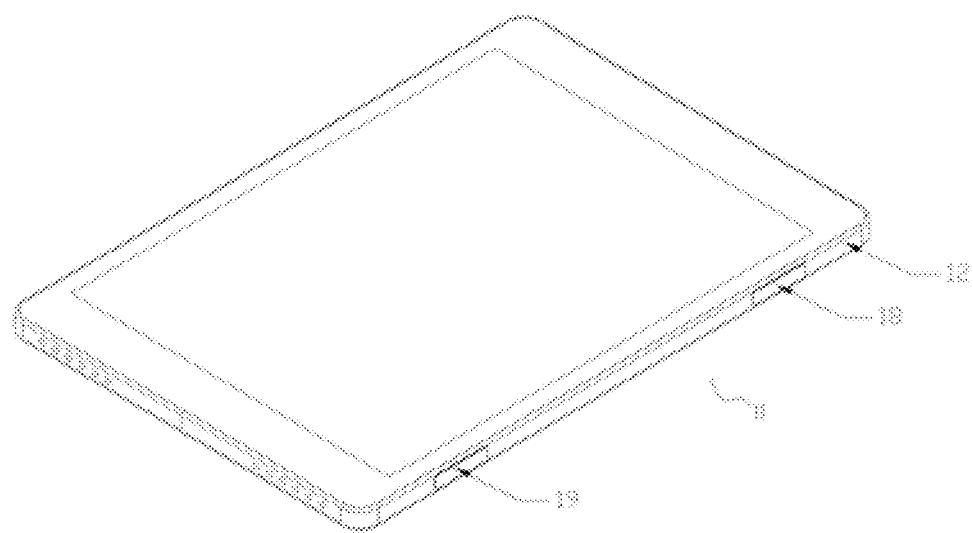
FIG. 1 is a schematic structural diagram of a mobile phone according to an embodiment of the present disclosure.

11: mobile phone; 12: side part; 13: cap part; 14: exciter; 15: elastic component; 16: FPCB; 17: gap; 18: first button sound-emitting apparatus; 19: second button sound-emitting apparatus; 20: sound channel control module; 21: long side wall; 22: short side wall; 23: annular step structure.

DETAILED DESCRIPTION

Various exemplary embodiments of the invention will now be described in detail with reference to the drawings. It should be noted that: unless specifically stated otherwise, the relative arrangement of components and steps, numerical expressions, and numerical values set forth in these embodiments do not limit the scope of the invention.

The following description of at least one exemplary embodiment is actually merely illustrative, and in no way serves as any limitation on the invention and its application or use.

The technologies, methods, and devices known to those of ordinary skill in the relevant fields may not be discussed in detail, but where appropriate, the technologies, methods, and devices should be regarded as part of the specification.

In all examples shown and discussed herein, any specific values should be interpreted as exemplary only and not as limitations. Therefore, other examples of the exemplary embodiment may have different values.

It should be noted that similar reference numerals and letters indicate similar items in the following drawings, so once an item is defined in one drawing, it does not need to be further discussed in subsequent drawings.

Figure 4:
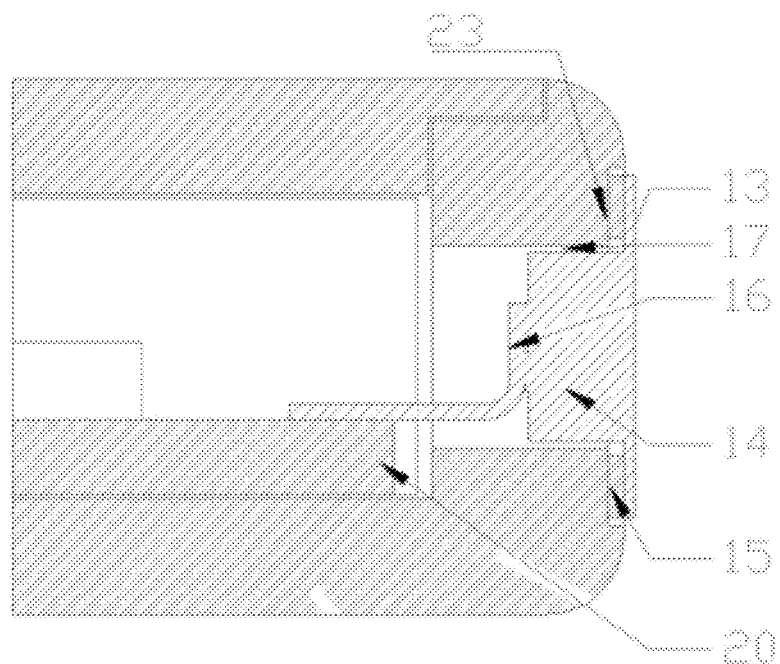
FIG. 4 is a partial enlarged view of the reference sign I in FIG. 3.

According to an embodiment of the present disclosure, a button sound-emitting apparatus is provided. As shown in FIG. 4, the apparatus comprises a cap part 13, an exciter 14 and an elastic component 15. The elastic component 15 is arranged at an edge of the cap part 13. The exciter 14 is arranged in the middle of the cap part 13. The elastic component 15 is connected to the housing of the electronic device. The exciter 14 is suspended in the housing. The elastic component 15 is configured to provide an elastic restoring force to restore the cap part 13 to its original position. The exciter 14 is configured to provide a driving force to enable the cap part 13 to deviate from its original position and vibrate.

For example, the cap part 13 is of a sheet-like structure, and may be a round sheet, a rectangular sheet, or a racetrack-shaped sheet. The sheet-like structure has a good sound effect. The elastic component 15 is arranged at a side edge of the cap part 13, or an edge of the front surface or the back surface of the cap part 13. The front surface refers to the surface of the cap part 13 configured to be pressed, and the back surface refers to the surface opposite to the front surface.

For example, the cap part 13 is made of inorganic non-metal, metal or polymer material. Preferably, the cap part 13 has a Young's modulus above 2000 MPa, and the density below 2.7 g/cm3. The cap part 13 within this range has the characteristics of high structural strength and light weight, etc., which can effectively reduce the split vibration of the button sound-emitting apparatus, and thus only a small driving force is required during vibration.

For example, the exciter 14 comprises a piezoelectric exciter, a moving coil exciter, a moving iron exciter, a moving magnet exciter, or a magnetostrictive exciter. The exciter 14 is fixed at the middle position of the cap part 13 by glue. The exciter 14 receives an electric signal from an external circuit, thereby generating the vibration. The exciter 14 drives the cap part 13 to vibrate, thereby radiating the sound outwards.

The elastic component 15 has elasticity, so as to return the cap part 13 to its original position. For example, the material of the elastic component 15 is a polymer material. The polymer material comprises the material such as PI, PP, PEN, PPT or the high-elastomer. All the above materials can provide the elastic restoring force. Preferably, the elastic component 15 is a double-sided tape. Double-sided tape has good compression and resilience, and is easy to bond. Compared with the use of glue for bonding, the double-sided tape will not have the problem of glue overflow. For example, the thickness of the double-sided tape is more than 0.05 mm.

In an example, the elastic component 15 is of a loop structure, such as a rectangular loop shape, a circular ring shape, a racetrack loop shape, and the like. The elastic component 15 is glued to the edge of the back surface of the cap part 13. During the assembly, a side of the elastic component 15 distal from the cap part 13 is fixed on the housing of the electronic device.

In one example, the elastic component 15 is of a block structure. A plurality of elastic components 15 are distributed along the edge of the back surface of the cap part 13, and are connected to the cap part 13 by glue. This arrangement may also provide an elastic restoring force for the vibration of the cap part 13.

The cap part 13 maintains an appearance design consistent with the outer surface of the electronic device. For example, the cap part 13 is flush with the outer surface of the housing of the electronic device. The gap formed between the cap part 13 and the housing of the electronic device is less than 0.2 mm to ensure good integrity of the electronic device.

In the embodiment of the present disclosure, the exciter 14 vibrates and drives the cap part 13 to vibrate to directly radiate the sound outwards. The sound-emitting direction is perpendicular to the main plane of the cap part 13, such as the front or back surface. The button sound-emitting apparatus is installed on a surface of the electronic device. The button sound-emitting apparatus directly radiates the sound outwards without a front acoustic cavity or a sound-emitting hole, and would not form an acoustic resonator. This ensures a good sound-emitting effect of the button sound-emitting apparatus, and especially a good sound-emitting effect of high frequency (for example, the frequency above 2 KHz).

In addition, the sound-emitting direction of the button sound-emitting apparatus is the same as the installation direction, and can be arranged on the electronic device at a side 12 thereof, such as at a long side wall 21 or a short side wall 22.

In addition, the cap part 13 of the button sound-emitting apparatus also has the function of the button itself, such as volume adjustment, item switching, etc.

According to another embodiment of the present disclosure, an electronic device is provided. For example, the electronic device comprises mobile phone 11, tablet computer, laptop, game console, walkie-talkie, television, and so on.

Figure 2:
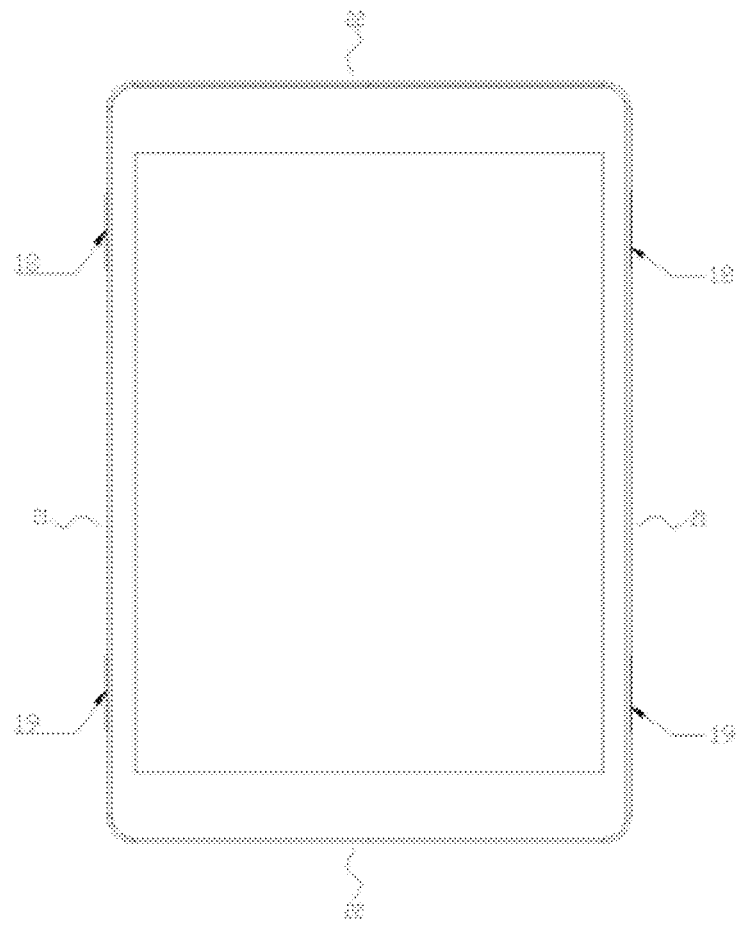
FIG. 2 is a front view of a mobile phone according to an embodiment of the present disclosure.
Figure 3:
FIG. 3 is a cross-sectional view of a mobile phone according to an embodiment of the present disclosure.

As shown in FIGS. 1-3, the electronic device comprises a housing and the above-mentioned button sound-emitting apparatus. A mounting hole is formed on the housing. The elastic component 15 is connected to the housing. The exciter 14 is suspended in the mounting hole. The following takes the mobile phone 11 as an example for the description.

A mounting hole is provided on a side wall of the middle frame of the mobile phone 11. The button sound-emitting apparatus is arranged on a side wall of the housing. This position does not occupy the space on the front and back surfaces of the mobile phone 11, and is advantageous for the design of the full screen and the overall design of the appearance. The exciter 14 is suspended in the mounting hole. A gap 17 is formed between the exciter 14 and a wall of the hole, to prevent the wall of the hole from interfering with the exciter 14.

In an example, as shown in FIG. 4, a concave annular step structure 23 is provided in a portion of the housing surrounding the mounting hole. The elastic component 15 is embedded in the annular step structure 23. For example, the elastic component 15 is of an annular structure, and the elastic component 15 is bonded to the step surface of the annular step structure 23 by glue. This arrangement may effectively prevent the cap part 13 from protruding excessively from the outer surface of the electronic device, such as the mobile phone 11, such that the electronic device has a good appearance.

In addition, the annular step structure 23 may also play a role in positioning, making the installation of the elastic component 15 more accurate.

In an example, as shown in FIG. 4, the exciter 14 is electrically connected to the electronic device through an FPCB 16. For example, the exciter 14 is connected to the control apparatus 20 of the electronic device through the FPCB 16. The exciter 14 vibrates in response to the electrical signal of the control apparatus 20. Compared with the use of signal wire connection, FPCB 16 has a better durability.

In an example, as shown in FIGS. 1-2, there is provided a plurality of button sound-emitting apparatuses and the plurality of button sound-emitting apparatuses produce a stereo effect. For example, there are 4 button sound-emitting apparatuses. At least two button sound-emitting apparatuses radiate the sound in different directions, so as to achieve a stereo effect. This arrangement method may improve the sound experience of the electronic device.

In one example, a plurality of button sound-emitting apparatuses is arranged symmetrically on the housing in pairs. For example, as shown in FIG. 2, the mobile phone 11 is of a rectangular structure. The middle frame of the mobile phone 11 comprises two long side walls 21 and two short side walls 22. The four button sound-emitting apparatuses are symmetrically arranged on the two long side walls 21 of the rectangular mobile phone 11 in pairs to form a stereo effect.

In other examples, one button sound-emitting apparatus is arranged on both the two long side walls 21 and the two short side walls 22. This arrangement may also achieve the stereo effect.

Of course, the arrangement of a plurality of button sound-emitting apparatuses is not limited to the foregoing embodiments. Those skilled in the art may arrange according to the actual needs.

In an example, the electronic device further comprises a gravity sensor and a sound channel control module 20 connected to the gravity sensor. The gravity sensor is configured to sense the azimuth information of the electronic device. The sound channel control module 20 is configured to obtain the azimuth information and switch the sound channel modes of a plurality of button sound-emitting apparatuses according to the azimuth information.

For example, four button sound-emitting apparatuses of the mobile phone 11 are arranged symmetrically on the two long side walls 21 in pairs. When the mobile phone 11 is used in a vertical screen state (that is, the long side wall 21 is parallel to the vertical direction), the gravity sensor sends the azimuth signal used in the vertical screen to the sound channel control module 20. The sound channel control module 20 switches the two button sound-emitting apparatuses on the left side of the user in the vertical screen state to the left sound channel mode, and switches the two button sound-emitting apparatuses on the right side of the user to the right sound channel mode, thereby providing a better sound experience.

When the electronic device is used in a horizontal screen state (that is, the long side wall 21 is parallel to the horizontal direction), the gravity sensor sends the azimuth signal used by the horizontal screen to the sound channel control module 20. The sound channel control module 20 switches the two button sound-emitting apparatuses on the left side of the user in the horizontal screen state to the left sound channel mode, and switches the two button sound-emitting apparatuses on the right side of the user to the right sound channel mode, thereby providing a better sound experience.

In an example, the button sound-emitting apparatus may adjust the volume level and is used to manually adjust the volume by pressing the cap part 13; or the button sound-emitting apparatus may be used to switch the items; or the like.

In an example, the plurality of button sound-emitting apparatuses comprises a first button sound-emitting apparatus 18 and a second button sound-emitting apparatus 19. The operation frequency of the first button sound-emitting apparatus 18 is above 2 KHz, and the operation frequency of the second button sound-emitting apparatus 19 is below 1 KHz. A plurality of sound-emitting apparatuses with different operation frequencies may provide a wider range of sound-emitting frequencies, which ensures an excellent sound-emitting effect of the electronic device.

In other examples, there may be provided with only one button sound-emitting apparatus. For example, the one button sound-emitting apparatus may be arranged on any one of the long side walls 21 or short side walls 22.

Although some specific embodiments of the present invention have been described in detail through examples, those skilled in the art should understand that the above examples are only for the illustration and not for limiting the scope of the present invention. It should be understood by a person skilled in the art that the above embodiments can be modified without departing from the scope and spirit of the present invention. The scope of the present invention is defined by the attached claims.

The invention claimed is:

1. A button sound-emitting apparatus, comprising a cap part, an exciter, and an elastic component, wherein the elastic component is arranged at an edge of the cap part, the exciter is arranged in a middle of the cap part, the elastic component is connected to a housing of an electronic device, the exciter is suspended in the housing, the elastic component is configured to provide an elastic restoring force, and the exciter is configured to provide a driving force.

2. The button sound-emitting apparatus according to claim 1, wherein, the cap part is of a sheet-like structure.

3. The button sound-emitting apparatus according to claim 1, wherein, the exciter is selected from the group consisting of a piezoelectric exciter, a moving coil exciter, a moving iron exciter, a moving magnetic exciter or a magnetostrictive exciter.

4. The button sound-emitting apparatus according to claim 1, wherein, the elastic component is double-sided tape.

5. An electronic device, comprising the apparatus according to claim 1, wherein a mounting hole is formed on the housing, the elastic component is connected with the housing, and the exciter is suspended in the mounting hole.

6. The electronic device according to claim 5, wherein, a concave annular step structure is provided on the housing where it embraces the mounting hole, and the elastic component is embedded in the annular step structure.

7. The electronic device according to claim 5, wherein, the button sound-emitting apparatus is arranged on a side wall of the housing.

8. An electronic device comprising a plurality of devices according to claim 5, adapted to produce a stereo effect.

9. The electronic device according to claim 8, further comprising a gravity sensor and a sound channel control module connected to the gravity sensor, wherein the gravity sensor is configured to sense azimuth information of the electronic device, and the sound channel control module is configured to obtain the azimuth information and switch channel modes of a plurality of the button sound-emitting apparatuses according to the azimuth information.

10. The electronic device according to claim 8, wherein, a first plurality of the button sound-emitting apparatuses are adapted to have an operation frequency above 2 KHz, and a second plurality of the button sound-emitting apparatuses are adapted to have an operation frequency below 1 KHz.

11. The electronic device according to claim 8, wherein, a plurality of the button sound-emitting apparatuses are symmetrically arranged on the housing in pairs.

* * * * *